(12) United States Patent
Besling et al.

(10) Patent No.: US 11,001,495 B2
(45) Date of Patent: May 11, 2021

(54) SENSOR PACKAGE AND METHOD OF PRODUCING THE SENSOR PACKAGE

(71) Applicant: Sciosense B.V., AE Eindhoven (NL)

(72) Inventors: Willem Frederik Adrianus Besling, Eindhoven (NL); Casper Van Der Avoort, Waalre (NL); Coenraad Cornelis Tak, Waalre (NL); Remco Henricus Wilhelmus Pijnenburg, Hoogeloon (NL); Olaf Wunnicke, Eindhoven (NL); Hendrik Bouman, Nijmegen (NL)

(73) Assignee: Sciosense B.V., Eindhoven (NL)

( * ) Notice: Subject to any disclaimer, the term of this patent is extended or adjusted under 35 U.S.C. 154(b) by 0 days.

(21) Appl. No.: 16/312,002

(22) PCT Filed: Jun. 14, 2017

(86) PCT No.: PCT/EP2017/064623
§ 371 (c)(1),
(2) Date: Dec. 20, 2018

(87) PCT Pub. No.: WO2017/220417
PCT Pub. Date: Dec. 28, 2017

(65) Prior Publication Data
US 2019/0375628 A1    Dec. 12, 2019

(30) Foreign Application Priority Data

Jun. 21, 2016 (EP) ..................... 16175474

(51) Int. Cl.
*B81B 7/00* (2006.01)
*B81C 1/00* (2006.01)
*G01D 11/24* (2006.01)

(52) U.S. Cl.
CPC .......... *B81B 7/0048* (2013.01); *B81C 1/0023* (2013.01); *G01D 11/245* (2013.01);
(Continued)

(58) Field of Classification Search
None
See application file for complete search history.

(56) References Cited

U.S. PATENT DOCUMENTS 7,568,390 B2    8/2009  Shizuno
8,643,127 B2    2/2014  Dangtran et al.
(Continued)

FOREIGN PATENT DOCUMENTS

CN    1710427 A    12/2005
CN    101010807 A    8/2007
(Continued)

OTHER PUBLICATIONS

European Patent Office, International Search Report for PCT/EP2017/064623 dated Aug. 31, 2017.

*Primary Examiner* — Steven B Gauthier
(74) *Attorney, Agent, or Firm* — Slater Matsil, LLP

(57) ABSTRACT

The sensor package comprises a carrier (1) including electric conductors (13), an ASIC device (6) and a sensor element (7), which is integrated in the ASIC device (6). A dummy die or interposer (4) is arranged between the carrier (1) and the ASIC device (6). The dummy die or interposer (4) is fastened to the carrier (1), and the ASIC device (6) is fastened to the dummy die or interposer (4).

19 Claims, 2 Drawing Sheets

(52) U.S. Cl.
CPC . *B81B 2201/0264* (2013.01); *B81B 2207/015* (2013.01); *B81B 2207/07* (2013.01); *B81C 2203/032* (2013.01); *B81C 2203/0785* (2013.01)

(56) References Cited

U.S. PATENT DOCUMENTS

| | | |
|---|---|---|
| 9,372,110 B2 | 6/2016 | Cornu et al. |
| 9,691,687 B2 | 6/2017 | Kehrer et al. |
| 10,743,112 B2* | 8/2020 | Besling ............... B81C 1/00325 |
| 2005/0194685 A1* | 9/2005 | Weiblen .............. G01L 19/0636 |
| | | 257/738 |
| 2008/0173097 A1 | 7/2008 | Bauer et al. |
| 2012/0130671 A1* | 5/2012 | Horning ............... B81B 7/0016 |
| | | 702/141 |
| 2012/0299170 A1* | 11/2012 | Kehrer ................. H01L 23/495 |
| | | 257/673 |
| 2014/0090485 A1 | 4/2014 | Feyh et al. |
| 2016/0229689 A1* | 8/2016 | Kaanta ................. B81B 7/0048 |
| 2017/0197823 A1* | 7/2017 | Wachtler ............. B81B 7/0048 |

FOREIGN PATENT DOCUMENTS

| | | |
|---|---|---|
| CN | 102132136 A | 7/2011 |
| CN | 102800660 A | 11/2012 |
| CN | 203203674 U | 9/2013 |
| EP | 2455329 | 5/2012 |
| WO | 2002/048668 | 6/2002 |

\* cited by examiner

SENSOR PACKAGE AND METHOD OF PRODUCING THE SENSOR PACKAGE

BACKGROUND OF THE INVENTION

Many integrated sensor devices such as pressure sensors, Hall sensors, gyroscopes or inertial sensors are generally highly susceptible to the influence of stress, which can worsen the performance and even damage fragile sensor structures. This problem is aggravated in the case of pressure sensors, which require direct access to the environment.

WO 2002/048668 A2 discloses an integrated CMOS capacitive pressure sensor.

US 2014/0090485 A1 discloses a MEMS pressure sensor assembly comprising a first die assembly including a MEMS pressure sensor and a second die assembly including an ASIC configured to generate an electrical output corresponding to a pressure sensed by the MEMS pressure sensor. A conducting member is positioned between the first die assembly and the second die assembly and electrically connects the MEMS pressure sensor and the ASIC.

SUMMARY OF THE INVENTION

The sensor package comprises a carrier including electric conductors and an ASIC device with an integrated sensor element. A dummy die or interposer is arranged between the carrier and the ASIC device and is fastened to the carrier. In particular, the dummy die or interposer may include an electrically inactive semiconductor substrate, or it may comprise an insulator, especially a glass. The ASIC device is fastened to the dummy die or interposer.

In an embodiment of the sensor package, an adhesive layer comprising silicone is arranged between the dummy die or interposer and the ASIC device. In particular, the adhesive layer may be at least 80 µm thick.

A further embodiment comprises a cover with an opening. The dummy die or interposer and the ASIC device are arranged between the carrier and the cover.

In a further embodiment the sensor element is a pressure sensor.

In a further embodiment the sensor element is sensitive to stress.

In a further embodiment the dummy die or interposer has smaller lateral dimensions than the ASIC device.

In a further embodiment the ASIC device laterally overhangs the dummy die or interposer at least on one side by at least 100 µm.

A further embodiment comprises a bond layer, which comprises a die attach foil and is arranged between the carrier and the dummy die or interposer.

The method of producing a sensor package comprises providing a carrier including electric conductors, fastening a dummy die or interposer on the carrier, providing an ASIC device comprising an integrated sensor element, and fastening the ASIC device to the dummy die or interposer.

In a variant of the method, the ASIC device is fastened to the dummy die or interposer by an adhesive layer, which may especially comprise silicone. In particular, the adhesive layer may be formed at least 80 µm thick.

In a further variant of the method, the dummy die or interposer (4) is fastened to the carrier by a bond layer comprising a die attach foil.

The following is a detailed description of examples of the sensor package and the method of production in conjunction with the appended figures.

DETAILED DESCRIPTION

Figure 1:
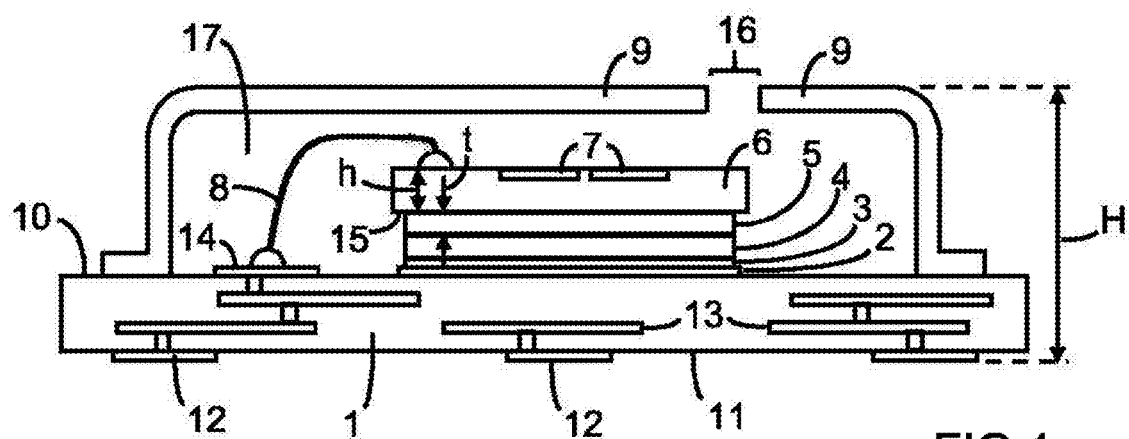
FIG. 1 is a cross section of a sensor package comprising a dummy die or interposer.

FIG. 1 is a cross section of a sensor package comprising a carrier 1 with integrated electric conductors 13, a bottom pad 2 on or above a top surface 10 of the carrier 1, a bond layer 3 on the bottom pad 2, a dummy die or interposer 4 on the bond layer 3, an adhesive layer 5 on the dummy die or interposer 4, an ASIC device 6 with integrated sensor elements 7 on the adhesive layer 5, electric interconnections 8 between the ASIC device 6 and contact pads 14 on the top surface 10 of the carrier 1, a cover 9 on the top surface 10, and terminal contacts 12 on the rear surface 11 of the carrier 1, opposite the top surface 10. The dummy die or interposer 4 provides a mechanical decoupling of the ASIC device 6 from the carrier 1. Deformations that may be caused by external forces acting on the sensor package may thus be prevented from adversely affecting the sensor element 7 integrated in the ASIC device 6.

The carrier 1 may be a printed circuit board, for instance, in particular a laminate. The terminal contacts 12 on the rear surface 11 of the carrier 1 may be formed in the shape of a land grid array, for instance. The integrated electric conductors 13 may provide a wiring or redistribution. The dummy die or interposer 4 may comprise semiconductor material, which may in particular be silicon, and may especially include an electrically inactive semiconductor substrate. The dummy die or interposer 4 may instead comprise an insulator or glass, for instance. The coefficient of thermal expansion of the insulator or glass may in particular be adapted to the coefficient of thermal expansion of the ASIC device 6.

The bottom pad 2 is optional. The bond layer 3 may be a die attach foil, for instance.

The adhesive layer 5 may especially comprise silicone, i.e. a compound obtained by polymerizing siloxane. The silicone may be applied like a glue to fasten the ASIC device 6 to the dummy die or interposer 4. The thickness t of the adhesive layer 5 is larger than 60 µm, typically at least 80 µm for an effective mechanical decoupling between the ASIC device 6 and the dummy die or interposer 4.

The ASIC device 6 may be a CMOS device, for instance. The sensor element 7 may be any conventional sensor, especially a pressure sensor or array of pressure sensors, which may be realized as a microelectromechanical system, for instance. The sensor element 7 may also comprise a sensor sensitive to stress. The mechanical decoupling of the ASIC device 6 from the carrier 1 is improved if the dummy die or interposer 4 has smaller lateral dimensions than the ASIC device 6, so that a lateral overhang 15 is formed at least on one lateral side or edge of the ASIC device 6. The overhang 15 may be considerably larger than the overhang 15 shown in FIG. 1.

The electric interconnections 8 between the ASIC device 6 and contact pads 14 on the top surface 10 of the carrier 1 may be bond wires, for instance, as shown in FIG. 1. The stack of the dummy die or interposer 4 and the ASIC device 6 is accommodated in a cavity 17, which is formed by the carrier 1 and the cover 9. The electric interconnections 8 and the contact pads 14 are also inside the cavity 17. The cover 9 may comprise a metal lid. If the sensor element 7 is a pressure sensor requiring access to the environment, an opening 16 is provided in the cover 9.

Typically the thickness of the carrier 1 may be in the range from 130 μm to 170 μm, the thickness of the bond layer 3 about 20 μm, the thickness of the dummy die or interposer 4 in the range from 50 μm to 200 μm, the thickness of the adhesive layer 5 in the range from 60 μm to more than 100 μm, the height h of the ASIC device 6 in the range from 140 μm to 400 μm, and the overall height H of the sensor package, including the cover 9, in the range from 600 μm to 1100 μm.

Figure 2:
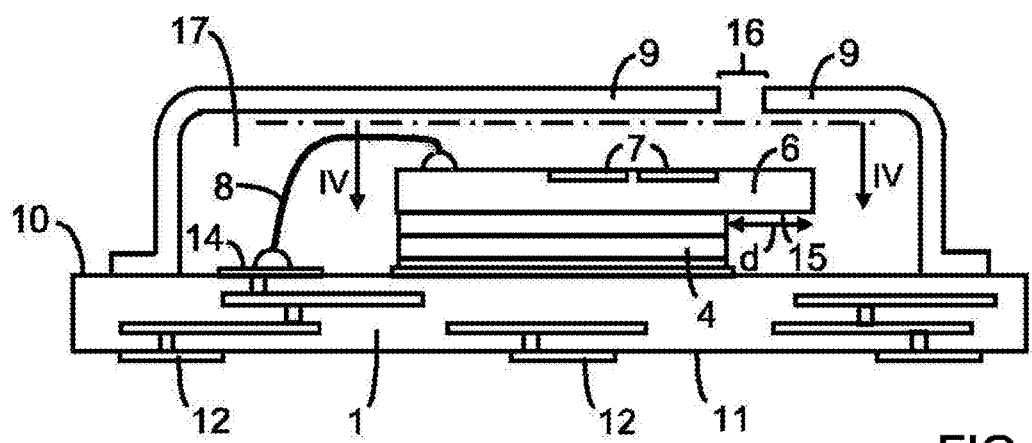
FIG. 2 is a cross section of a further sensor package comprising a dummy die or interposer and an overhanging ASIC device.

FIG. 2 is a cross section of a further sensor package comprising a dummy die or interposer 4. Elements of the sensor package according to FIG. 2 that are similar to corresponding elements of the sensor package according to FIG. 1 are designated with the same reference numerals. In the sensor package according to FIG. 2, the lateral overhang 15 of the ASIC device 6 over the dummy die or interposer 4 is larger than in the sensor package according to FIG. 1, in order to improve the mechanical decoupling. In particular, the overhang 15 may be larger on two or three adjoining lateral sides or edges of the ASIC device 6, the shape of such an arrangement resembling the mushroom called turkey tail (trametes versicolor). The indicated dimension d of the overhang 15 may be typically larger than 50 μm or even larger than 100 μm.

Figure 3:
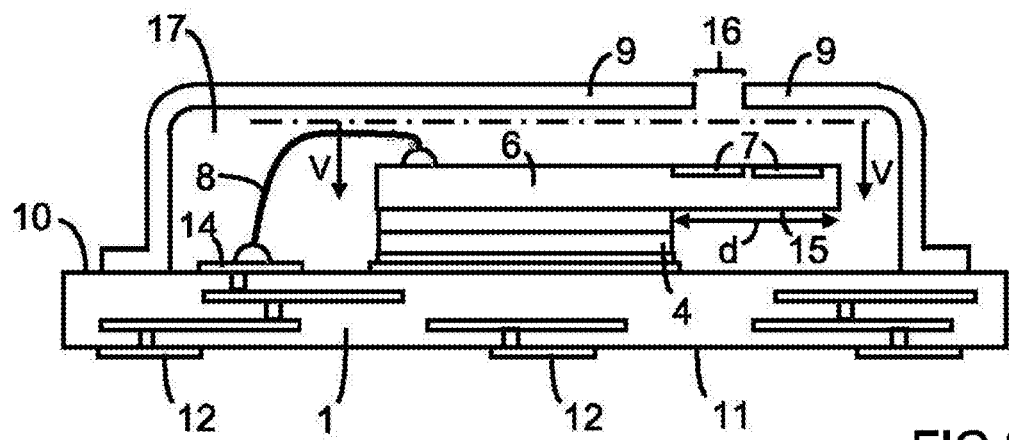
FIG. 3 is a cross section of a further sensor package comprising a dummy die or interposer and an ASIC device with larger overhang.

FIG. 3 is a cross section of a further sensor package comprising a dummy die or interposer 4. Elements of the sensor package according to FIG. 3 that are similar to corresponding elements of the sensor package according to FIG. 1 are designated with the same reference numerals. In the sensor package according to FIG. 3, the lateral overhang 15 of the ASIC device 6 over the dummy die or interposer 4 is even larger than in the sensor package according to FIG. 2. The overhang 15 may be present on one lateral side or edge or on two or three adjoining lateral sides or edges. The larger overhang 15 allows the sensor element 7 to be shifted from the region of the ASIC device 6 that is supported by the dummy die or interposer 4 towards the region of the overhang 15, in order to enhance the mechanical decoupling of the sensor element 7. The dimension d of the overhang 15 indicated in FIG. 3 may be typically larger than 100 μm.

Figure 4:
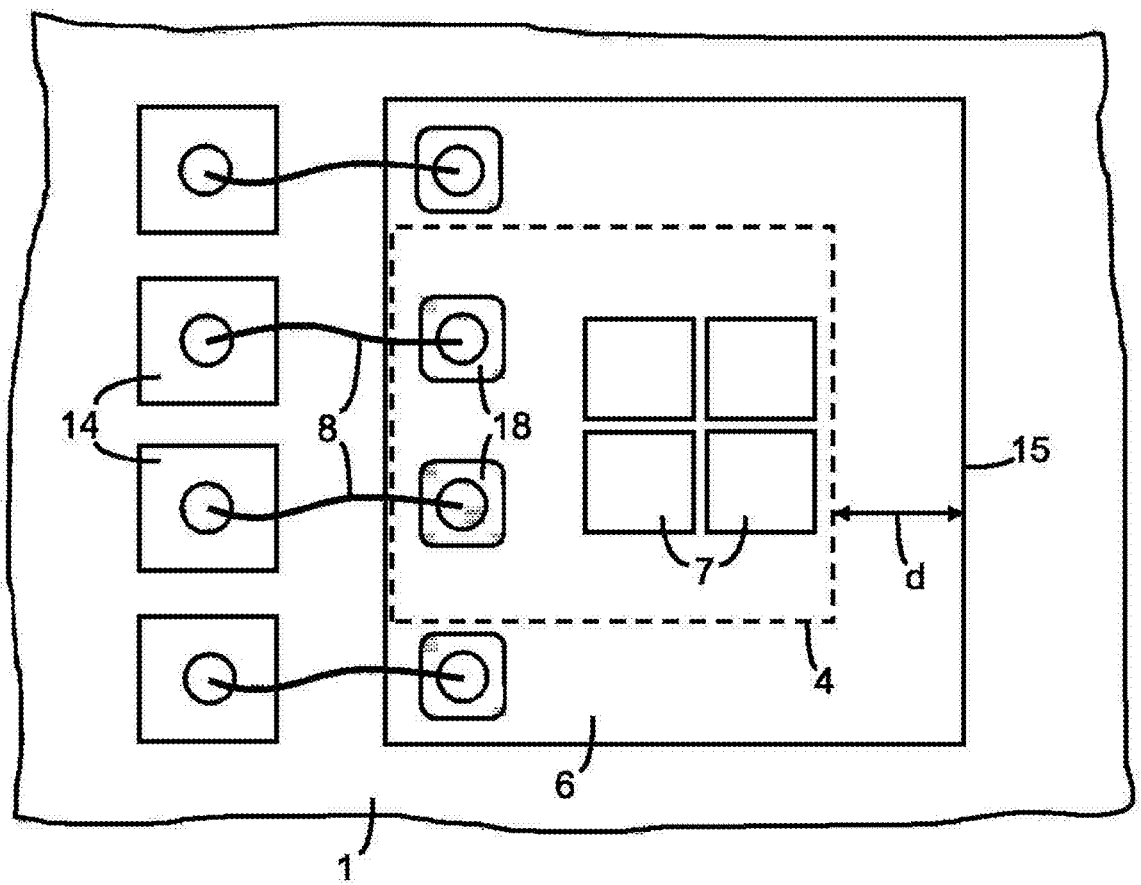
FIG. 4 is a top view corresponding to the indication in FIG. 2.

FIG. 4 is a top view onto the stack of the dummy die or interposer 4 and the ASIC device 6 of the sensor package according to FIG. 2, corresponding to the indication "IV" with arrows pointing down in FIG. 2. The hidden contours of the dummy die or interposer 4, which is covered by the ASIC device 6, are represented in FIG. 4 with broken lines. Contact areas 18 of the ASIC device 6, which may be contact pads or uncovered surface areas of an uppermost metallization level of a wiring, for instance, are electrically connected to the contact pads 14 by interconnections 8, which are bond wires in this example. The number and the arrangement of the contact pads 14 and contact areas 18 can be varied according to individual requirements. The sensor element 7 may be arranged at or near the center of the ASIC device 6, as shown in FIG. 4 by way of example, or near the periphery of the ASIC device 6. FIG. 4 shows a typical "turkey tail" configuration with the large overhang 15 extending on three adjoining lateral sides or edges of the ASIC device 6. Instead, the large overhang 15 may only be present on two adjoining lateral sides or edges of the ASIC device 6.

Figure 5:
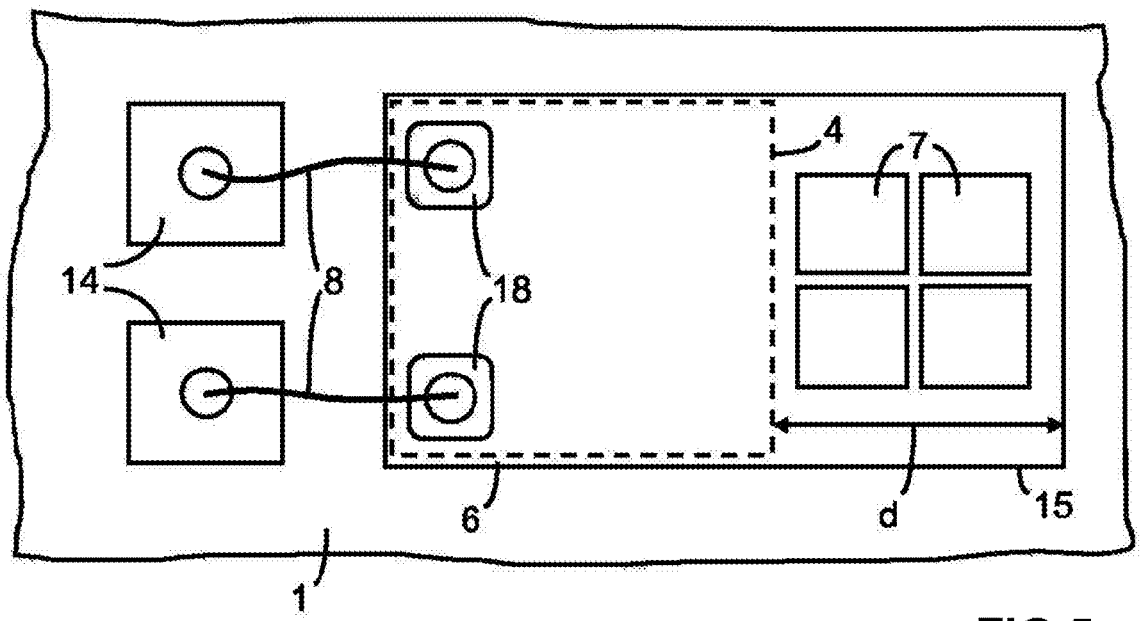
FIG. 5 is a top view corresponding to the indication in FIG. 3.

FIG. 5 is a top view onto the stack of the dummy die or interposer 4 and the ASIC device 6 of the sensor package according to FIG. 3, corresponding to the indication "V" with arrows pointing down in FIG. 3. The hidden contours of the dummy die or interposer 4, which is covered by the ASIC device 6, are represented in FIG. 5 with broken lines. Contact areas 18 of the ASIC device 6, which may be contact pads or uncovered surface areas of an uppermost metallization level of a wiring, for instance, are electrically connected to the contact pads 14 by interconnections 8, which are bond wires in this example. The number and the arrangement of the contact pads 14 and contact areas 18 can be varied according to individual requirements. The sensor element 7 is arranged in the area of the overhang 15. FIG. 5 shows a "diving board" configuration with a large overhang 15 only on one lateral side or edge of the ASIC device 6. Instead, the large overhang 15 may be present on two or three adjoining lateral sides or edges of the ASIC device 6, as in the example shown in FIG. 4.

The sensor package is especially favorable for stress sensitive sensors. The sensor element and the circuitry are integrated on a single die, which allows to reduce the overall height of the sensor package substantially. At the same time stress decoupling is enhanced by the electrically inactive dummy die or interposer. Stress caused by thermal expansion is prevented if the coefficient of thermal expansion of the dummy die or interposer is adapted to the coefficient of thermal expansion of the ASIC device, in particular if the dummy die or interposer comprises the same semiconductor material and hence the same coefficient of thermal expansion as the ASIC device.

The invention claimed is:

1. A sensor package comprising:
   a carrier including electric conductors;
   an ASIC device;
   a sensor element integrated in the ASIC device; and
   an electrically inactive, unstructured dummy die or interposer arranged between the carrier and the ASIC device, the dummy die or interposer being fastened to the carrier,
   wherein the ASIC device is fastened to the dummy die or interposer,
   wherein a coefficient of thermal expansion of the dummy die or interposer is adapted to a coefficient of thermal expansion of the ASIC device,
   wherein the ASIC device is fastened to the dummy die or interposer by a silicone comprising glue,
   wherein the ASIC device laterally overhangs the dummy die or interposer,
   wherein the sensor element is arranged on a portion of the ASIC device that laterally overhangs the dummy die or interposer, and
   wherein the sensor element is arranged on a side of the ASIC device that faces away from the dummy die or interposer.

2. The sensor package according to claim 1, wherein the dummy die or interposer includes an electrically inactive semiconductor substrate.

3. The sensor package according to claim 1, wherein the dummy die or interposer comprises an insulator or glass.

4. The sensor package according to claim 1, wherein the silicone comprising glue is comprised by an adhesive layer between the dummy die or interposer and the ASIC device.

5. The sensor package according to claim 4, wherein the adhesive layer is at least 80 μm thick.

6. The sensor package according to claim 1, further comprising a cover with an opening, the dummy die or interposer and the ASIC device being arranged between the carrier and the cover.

7. The sensor package according to claim 1, wherein the sensor element is a pressure sensor.

8. The sensor package according to claim 1, wherein the sensor element is sensitive to stress.

9. The sensor package according to claim 1, wherein the dummy die or interposer has smaller lateral dimensions than the ASIC device.

10. The sensor package according to claim 1, wherein the ASIC device laterally overhangs the dummy die or interposer by at least 100 μm.

11. The sensor package according to claim 1, further comprising a bond layer between the carrier and the dummy die or interposer, the bond layer comprising a die attach foil.

12. A sensor package comprising:
a carrier including electric conductors;
an ASIC device;
a sensor element integrated in the ASIC device; and
an electrically inactive, unstructured dummy die or interposer arranged between the carrier and the ASIC device, the dummy die or interposer being fastened to the carrier,
wherein the ASIC device is fastened to the dummy die or interposer,
wherein the ASIC device laterally overhanging the dummy die or interposer by at least 100 μm,
wherein a coefficient of thermal expansion of the dummy die or interposer is adapted to a coefficient of thermal expansion of the ASIC device,
wherein the ASIC device is fastened to the dummy die or interposer by a silicone comprising glue,
wherein the sensor element is arranged on a portion of the ASIC device that laterally overhangs the dummy die or interposer, and
wherein the sensor element is arranged on a side of the ASIC device that faces away from the dummy die or interposer.

13. The sensor package according to claim 12, wherein the silicone comprising glue is at least 80 μm thick.

14. The sensor package according to claim 12, further comprising a cover with an opening, the dummy die or interposer and the ASIC device being arranged between the carrier and the cover.

15. The sensor package according to claim 12, wherein the sensor element is a pressure sensor.

16. The sensor package according to claim 12, wherein the sensor element is sensitive to stress.

17. The sensor package according to claim 12, further comprising a bond layer between the carrier and the dummy die or interposer, the bond layer comprising a die attach foil.

18. The sensor package according to claim 12, wherein the dummy die or interposer includes an electrically inactive semiconductor substrate.

19. The sensor package according to claim 12, wherein the dummy die or interposer comprises an insulator or glass.

* * * * *